United States Patent
Debroux

(10) Patent No.: US 7,088,184 B2
(45) Date of Patent: Aug. 8, 2006

(54) HIGH FREQUENCY AMPLIFIER IN AN INTEGRATED CIRCUIT

(75) Inventor: Jean-François Debroux, St Etienne de St Geoirs (FR)

(73) Assignee: ATMEL Grenoble S.A., Saint Egreve (FR)

( * ) Notice: Subject to any disclaimer, the term of this patent is extended or adjusted under 35 U.S.C. 154(b) by 68 days.

(21) Appl. No.: 10/514,506

(22) PCT Filed: May 16, 2003

(86) PCT No.: PCT/FR03/01504

§ 371 (c)(1),
(2), (4) Date: Nov. 15, 2004

(87) PCT Pub. No.: WO03/103133

PCT Pub. Date: Dec. 11, 2003

(65) Prior Publication Data

US 2006/0049877 A1    Mar. 9, 2006

(30) Foreign Application Priority Data

May 31, 2002    (FR) .................................. 02 06723

(51) Int. Cl.
*H03F 3/04* (2006.01)
(52) U.S. Cl. ....................... 330/301; 330/307; 330/252
(58) Field of Classification Search ................ 330/301, 330/307, 300, 252
See application file for complete search history.

(56) References Cited

U.S. PATENT DOCUMENTS

| | | | |
|---|---|---|---|
| 4,254,381 A * | 3/1981 | Wheatley, Jr. .............. 330/301 |
| 5,034,701 A | 7/1991 | Debroux |
| 5,159,286 A | 10/1992 | Ito |
| 5,278,518 A | 1/1994 | Debroux |
| 5,376,900 A | 12/1994 | Debroux |
| 5,506,525 A | 4/1996 | Debroux |
| 5,530,404 A | 6/1996 | Debroux |
| 5,844,443 A * | 12/1998 | Wong .......................... 330/275 |
| 5,914,639 A | 6/1999 | Debroux |
| 5,994,959 A * | 11/1999 | Ainsworth ................... 330/252 |
| 6,806,769 B1 * | 10/2004 | Imayama et al. ............ 330/252 |

* cited by examiner

*Primary Examiner*—Patricia Nguyen
(74) *Attorney, Agent, or Firm*—Lowe Hauptman & Berner, LLP

(57) ABSTRACT

The invention concerns an integrated circuit amplifier designed to supply an amplified signal at a power of a few hundreds of milliwatts at frequencies from one to several Gigahertz. The final stage of the amplifier comprises two signal amplification input points E and E' receiving in differential mode a signal to be amplified, and four main transistors of the same type of conductivity, each having a base, an emitter and a collector, including a first transistor or output transistor mounted in common emitter configuration, whereof the collector is linked to the output of the integrated circuit, a second transistor mounted in voltage follower configuration between the point E and the base of the output transistor, a third transistor mounted in common emitter configuration, having its collector linked to the base of the output transistor, a fourth transistor mounted in voltage follower configuration having its base linked to the point E' and its emitter linked to the base of the third transistor, the circuit also comprising a first current source linked to the base of the first transistor and a second current source linked to the base of the third transistor and to the emitter of the fourth transistor.

20 Claims, 1 Drawing Sheet

HIGH FREQUENCY AMPLIFIER IN AN INTEGRATED CIRCUIT

CROSS-REFERENCE TO RELATED APPLICATIONS

The present Application is based on International Application No. PCT/FR03/01504, filed on May 16, 2003, which in turn corresponds to FR 02/06723 filed on May 31, 2002, and priority is hereby claimed under 35 USC §119 based on these applications. Each of these applications are hereby incorporated by reference in their entirety into the present application.

1. Field of the Invention

The invention relates to amplifiers produced as silicon integrated circuits and capable of providing power levels of the order of several hundreds of milliwatts at frequencies of around one Gigahertz or above, by amplifying an input signal with a gain of at least 20 to 30 dB and with an adequate efficiency (for example, better than 30%).

2. Background of the Invention

Such amplifiers are mainly applicable to low power radiofrequency transmissions using very small circuits that are as inexpensive as possible. To give the amplifier the smallest possible footprint, it is desirable to produce it using a single integrated circuit to which are linked a small number of external components. One cost factor is in fact the presence of external components, not only because of their own cost and their mounting cost, but mainly because additional leads must be provided on the integrated circuit solely to connect these components to points inside the amplifier.

An amplifier working at radio frequencies would normally require a number of amplification stages and usually impedance matching inductances and capacitances between the stages. At the radio frequencies considered (from around 1 GHz to several GHz), these inductances and capacitances would be too bulky to be incorporated in the silicon integrated circuit chip. It would therefore normally be necessary to provide the integrated circuit with specific leads for connecting external capacitances and inductances for impedance matching between stages.

One object of the invention is therefore to propose a radiofrequency amplifier circuit requiring no impedance matching capacitance or inductance between stages.

SUMMARY OF THE INVENTION

For this, an integrated circuit is proposed comprising an amplifier whose final stage comprises two signal amplification input points E and E' receiving in differential mode a signal to be amplified, and four main transistors of the same type of conductivity, each having a base, an emitter and a collector, including a first transistor or output transistor mounted in common emitter configuration, whereof the collector is linked to an output of the integrated circuit, a second transistor mounted in voltage follower configuration between the point E and the base of the output transistor, a third transistor mounted in common emitter configuration, having its collector linked to the base of the output transistor, a fourth transistor mounted in voltage follower configuration having its base linked to the point E' and its emitter linked to the base of the third transistor, the circuit also comprising a first current source linked to the base of the first transistor and a second current source linked to the base of the third transistor.

Instead of using impedance matching inductances and capacitances upline from an output transistor, a circuit with two transistors (second and third transistors) of the same polarity, operating in the manner of a push-pull stage, is therefore used.

The invention is applicable more advantageously if the transistors mentioned above are bipolar transistors. However, consideration can also be given to implementation with MOS field effect transistors, and in this case, for a general definition of the invention using the simple vocabulary of bipolar transistors, it will be considered that the words base, emitter and collector respectively correspond to the gate, source and drain of the MOS transistor.

Preferably, the size of the first transistor is N times greater than that of the third transistor and the size of the second transistor is in the same ratio N with the fourth transistor, the first and second sources supplying currents in the same ratio N.

Preferably, a fifth transistor will be provided, having its base biased by a fixed voltage, its emitter linked to the ground via a resistance, and its collector linked to the base of the third transistor and to the emitter of the fourth. It will preferably have a size N times smaller than that of the third transistor. The ratio N is chosen to be fairly high, for example equal to 8 or 16, to reduce the size of the second, third, fourth and fifth transistors and their quiescent currents in the same ratio, the size of the first transistor being dictated by the required output current, and therefore by the required output power.

Preferably again, the amplifier according to the invention comprises two identical half-amplifiers, controlled by identical differential input voltages but in phase opposition. The integrated circuit then has two outputs and these outputs each supply, in phase opposition, half of the required output power. These outputs can be combined outside the integrated circuit by a coupling circuit which combines the currents supplied by the two outputs, placing them in phase and if necessary matching their impedance.

The integrated circuit according to the invention can include elements other than the output amplifier. In a particular application, the integrated circuit is a frequency synthesizer, comprising a controlled-frequency oscillator and the amplifier. It then produces a required radio frequency, amplifies it and supplies it to its output at a power level of several hundreds of milliwatts.

BRIEF DESCRIPTION OF DRAWINGS

Other features and advantages of the invention will become apparent on reading the detailed description that follows, which is given in reference to the appended drawings in which.

DETAILED DESCRIPTION OF PREFERRED EMBODIMENT

Figure 1:
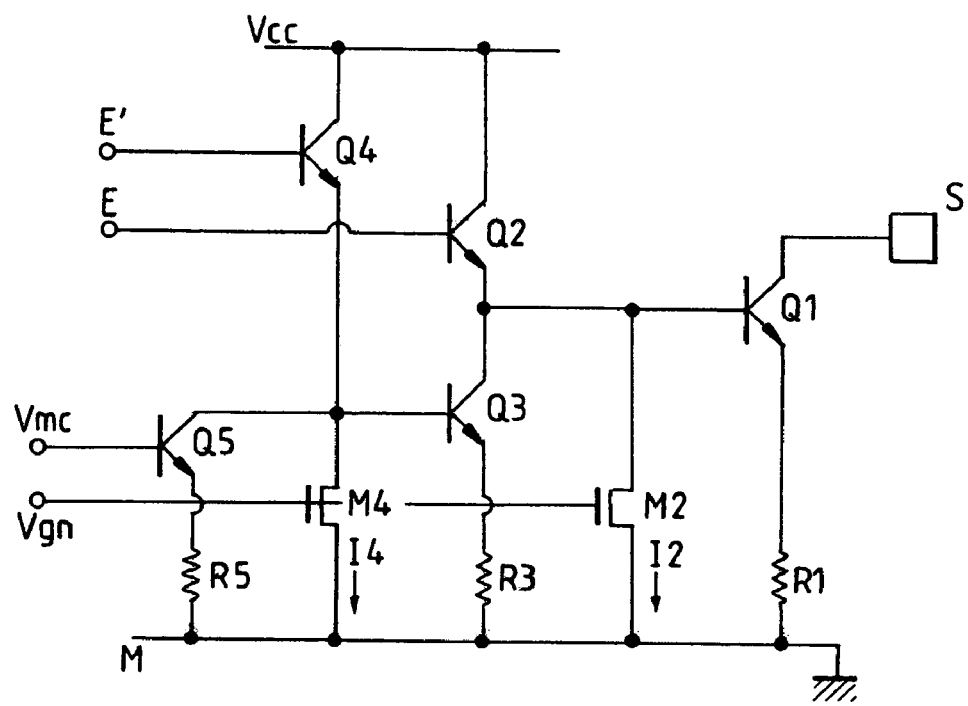
FIG. 1 is a schematic diagram of the amplifier according to the invention.

FIG. 1 shows the final stage of the amplifier according to the invention. The preceding stages, if there are any, pose no particular problems and are not described. They supply the final stage with a differential signal to be amplified, between two input points E and E' of the final stage.

The potentials of the inputs E and E' vary in phase opposition around a common mode potential Vmc defined by the output bias of the stage preceding the final stage.

The final stage of the amplifier mainly comprises four transistors Q1 to Q4 the connections and functions of which are described. It preferably 30 also includes a fifth auxiliary transistor Q5.

In the preferred embodiment described here, the integrated circuit technology used is a mixed bipolar and CMOS technology (BiCMOS technology). In this case, the five transistors Q1 to Q5 are bipolar transistors. Only in the case where the technology used would be purely MOS or CMOS would the transistors necessarily be field effect transistors.

The first transistor Q1 is the output transistor of the amplifier. Its collector is linked to an output lead S of the integrated circuit. This transistor is mounted in common emitter configuration (control via the base, emitter linked via a resistor R1 to a ground M of the circuit, output on the collector).

The base of the transistor Q1 is controlled simultaneously by the emitter of the second transistor Q2 and the collector of the third transistor Q3. The second transistor Q2 supplies an increasing input current to the base of the output transistor Q1 when the input voltage at E increases and the voltage at E' decreases. Otherwise, in other words when the input voltage at E decreases and the voltage at E' increases, the third transistor Q3 draws an increasing current from the base of the output transistor Q1.

The base of the second transistor Q2 is linked directly to the input point E. The transistor Q2 is mounted in follower configuration (input to the base, output to the emitter, collector preferably directly linked to a positive power supply Vcc). Its emitter is directly linked to the base of the output transistor Q1.

The third transistor Q3 is mounted in common emitter configuration (control via the base, emitter linked via a resistor R3 to ground M, output on the collector linked to the base of the output transistor Q1). This third transistor has its base linked to the emitter of the fourth transistor Q4 to be controlled by the latter.

The fourth transistor Q4 is mounted in follower configuration (input on the base, output on the emitter, collector linked to the power supply Vcc). Its base is linked to the input E'. Its emitter is linked to the base of the third transistor Q3.

For the transistors Q2 and Q4 to operate correctly, in voltage follower configuration, their emitters will preferably each be linked via a respective constant current source linked to the ground M. Each current source preferably comprises a respective MOS transistor. For the transistor Q2, the current source is an MOS transistor M2 connected between the emitter of Q2 and the ground M and supplying a current I2; this transistor M2 has its base controlled by a constant potential Vgn; for the transistor Q4, the current source is an MOS transistor M4 connected between the emitter of Q4 and the ground M and supplying a current I4; this transistor M4 has its base controlled by the same potential Vgn as the transistor M2. The transistors M2 and M4 are homothetic, such that the currents I2 and I4 are in the same ratio as the sizes of the transistors M2 and M4. These transistors M2 and M4 could also be bipolar transistors.

The circuit operates according to the explanation below.

For the positive half-cycles of the differential signal to be amplified (taking the positive signal reference as follows: higher voltage at input E, lower voltage at input E', about the common mode potential Vmc), the output transistor Q1 tends to be made to conduct via the follower transistor Q2. At the same time, the transistor Q4 tends to be blocked, the current in the transistor Q3 decreases and therefore does not oppose the increase in conduction of the output transistor.

The situation is different for the negative half-cycles of the signal to be amplified. When the voltage at E decreases and the voltage at E' increases, the base current of the output transistor Q1 tends to decrease and the collector current of this transistor Q1 also decreases. The input capacitance of the transistor Q1 is relatively high and tends to oppose this lowering of the base current of Q1. However, the presence of the transistor Q3, which becomes more conductive because of its control by the transistor Q4, helps to reduce the base current of the transistor Q1.

The common mode potential Vmc (counted relative to ground M), about which the potentials at E and E' vary, can be approximately twice a transistor base-emitter voltage (for example 1.3 volts).

The size of the output transistor Q1 is sufficient to allow all of the required output current to pass, for example, a current of a few hundreds of milliamps. The transistor Q2 and the transistor Q3 are much smaller since they have to conduct a current approximating to the current needed to control the base of Q1. The ratio N between the size of the transistor Q1 and the transistor Q3 is preferably less than the square root of the current gain of the transistor Q1.

The transistor Q3 is controlled via the transistor Q4 in the same way as the transistor Q1 is controlled via the transistor Q2: the transistor Q3 is mounted in common emitter configuration and controlled by the transistor Q4 mounted in follower configuration, in the same way as the transistor Q1 is mounted in common emitter configuration and controlled by the transistor Q2 mounted in follower configuration. The ratio between the size of the transistor Q2 and that of the transistor Q4 is in theory equal to the ratio N between the size of Q1 and that of Q3 for the currents to be homothetic. The ratio between the currents I2 and I4 is the same ratio N, and the ratio between the sizes of the transistors M2 and M4 is also the same, these transistors having their gate controlled by the same potential Vgn.

The input impedance seen from point E (input on the base of Q2) is not a priori the same as that seen from point E' (input on the base of Q4), because the transistor Q4 is a priori charged only by the transistor Q3 and the current source I4, whereas the transistor Q2 is charged by the transistor Q1, the current source I2 and the transistor Q3 at the same time. This is why an auxiliary transistor Q5 is preferably added, disposed in relation to the transistor Q4 in the same way as the transistor Q3 is disposed in relation to the transistor Q2. The transistor Q5 has its emitter charged via an emitter resistance R5, its collector linked to the emitter of Q4, and its base is controlled by a constant potential V'mc equal to the average potential on the base of Q1.

The size of the transistor Q5 is N times smaller than the size of the transistor Q3, which is itself N times smaller than that of Q1. The emitter resistance R5 is N times greater than the resistance R3, which is itself N times greater than the resistance R1.

The result is that the transistor Q5 is N×N times smaller than the transistor Q1. The ratio N will be chosen such that the transistor Q5 is no smaller than is allowed by the technology given the size chosen for the transistor Q1. For example, a ratio N=8 or N=16 may be ideal for an amplifier whose output transistor is used to supply a current of 300 milliamps. This assumes, as has already been stated, that the current gain of the output transistor Q1 is at least equal to $N^2$, in other words, to 64 or 256, which does not pose any particular problems.

With the transistor Q5 thus correctly dimensioned, the current densities are structurally equal, so guaranteeing excellent independence of operation with respect to variations in technological parameters.

In practice, the choices of transistor dimensions and auxiliary transistors ensure that the biasing points of the transistors are identical and that one and the same base-emitter voltage variation on two homothetic transistors will generate homothetic current variations in the ratio of the transistor sizes. However, transistor capacitances also come into play at high frequencies. Now the input currents at E and E' are different and the capacitances seen on these inputs are different. The capacitance of a large transistor is greater than that of a small transistor, so that the capacitance seen at the input E is much greater than the capacitance seen at the input E' (in the ratio N).

Now the correct operation of the amplifier stage presupposes in theory that the signals at E and E' are genuinely in phase opposition, otherwise the efficiency of the amplifier can drop significantly (several efficiency percentage points lost for a phase shift of just a few degrees); however, the presence of different input capacitances tends to prevent an exact phase opposition, given that the output impedance of the stage located upline from the inputs E and E' is not infinitely low.

Consequently, an effort is made to resolve this problem without requiring an extremely low output impedance upline from the inputs E and E'. For this, the amplification stage is split into a first half-stage A1 and a second half-stage A2, which receive the same inputs but crossed over so as to act strictly in phase opposition. Thus, one of the input signals will be applied simultaneously to the transistor Q2 of the stage A1 and to the transistor Q4 of the stage A2, while the other input signal, in phase opposition with the first, will be applied to the transistor Q4 of the stage A1 and to the transistor Q2 of the stage A2. The outputs of the two amplifiers, in phase opposition since their inputs have been crossed, will be phase realigned before being added (current-wise) to form a single amplifier output. With this construction comprising two symmetrical half-stages, the problem of input capacitance imbalance is resolved since each input E or E' now sees in parallel both a large transistor (Q2) of one of the half-stages and a small transistor (Q4) of the other half-stage.

The half-stages A1 and A2 use transistors that are twice as small as if there were only one stage, for a predefined final output current, and therefore for a predefined amplifier power.

Figure 2:
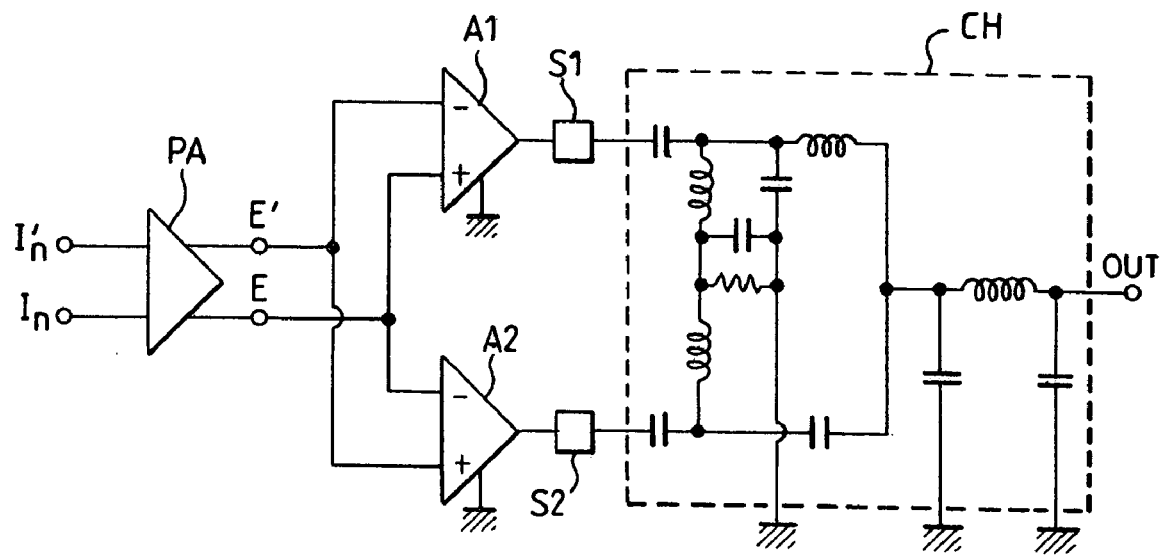
FIG. 2 represents an amplifier produced by linking two amplifier stages working in phase opposition, their outputs being coupled through a hybrid coupler.

FIG. 2 shows the construction of the duly split amplifier. In the embodiment shown, it was assumed that there was a common preamplifier stage PA receiving a differential input signal to be amplified. This input signal is applied between two inputs In and In'. The preamplifier supplies a differential output to two points E and E' with a common mode voltage Vmc which is adjusted by the biasing of the output transistors of the preamplifier. The main amplification stage comprises two identical half-amplifiers A1 and A2 each formed as shown in FIG. 1. It is assumed that these stages each have a first non-inverting input, identified by the positive sign + and a second input identified by the negative sign –. For example, the + input is that which corresponds to the base of the transistor Q2 while the – input is that which corresponds to the base of the transistor Q4.

The half-amplifiers have their inputs crossed, in other words the point E is connected to the + input of the stage A1 and to the – input of the stage A2, while, conversely, the point E' is linked to the – input of the stage A1 and to the + input of the stage A2.

The stage A1 has an output S1 which is an external lead of the integrated circuit. The stage A2 has a similar output S2, which is another external lead of the integrated circuit. The integrated circuit comprises two stages A1 and A2 and the preamplifier PA and, where appropriate, other elements not shown. The outputs S1 and S2 supply currents in phase opposition. These currents are added outside the integrated circuit, after being phase realigned.

This phase realignment and this addition can be performed by different means: transformer with appropriately oriented windings (for lower frequencies), or hybrid coupler (for higher frequencies), or even electromagnetically coupled lines (for very high frequencies). These elements at the same time provide impedance matching to match the output impedance of the amplifier to the impedance of the load to be powered, in the case where the output transistor of a stage A1 or A2 operates optimally at an output impedance which is not equal to the impedance of the load.

FIG. 2 shows a hybrid coupler CH with inductances and capacitances, the two inputs of which are connected to the output leads S1 and S2 and the output of which is formed by an OUT lead and ground. The OUT supplies the sum of the output currents of the amplifiers A1 and A2, phase realigned.

This output OUT can be directly connected to a radio antenna in a low power radio transmission application. The load can be 50 ohms, the frequency 917 MHz or above, and the power supply can be 2.4 to 3 volts if the integrated circuit is produced using silicon BiCMOS technology.

It will be noted that with this construction with two output currents in phase opposition, the amplifier emits a lower level radiated interference than if it had a single output. In fact, the half-currents in phase opposition tend to cancel their own radiations.

The amplifier circuit according to the invention can, among other things, provide a power level relatively independent of the variations in the power supply voltage Vcc, which is useful in battery-powered applications for which the power supply voltage tends to drop (because of the internal resistance of the battery) when the amplifier operates at full power.

The absence of tuned elements in the integrated circuit enables the amplifier to operate in a wide range of frequencies. Only the external elements (those of the hybrid coupler, for example) will be determined according to the required working frequency.

To bias the input of the half-amplifiers A1 and A2 at an input common mode voltage Vmc relatively independent of the temperature and technological variations, an auxiliary circuit can be used which acts on the biasing of the output of the preamplifier PA. For this, the same integrated circuit can incorporate an auxiliary amplifier identical to the amplifier stages A1 and A2 but of smaller size (all the transistors being homothetic with those of A1 and A2). This amplifier will have for its input a common mode voltage Vmc (no differential signal at the auxiliary amplifier input) which will be used to bias the output of the preamplifier. This common mode voltage will be controlled in such a way that the quiescent current in the auxiliary amplifier (and consequently in the amplifiers A1 and A2) is made stable, to a first degree, despite the variations in temperatures, power supply voltage and technology. The quiescent current stability obtained for the auxiliary amplifier by acting on the potential Vmc will generate a similar stability in the quiescent currents of the amplifiers A1 and A2 biased by the same common mode voltage Vmc.

The integrated circuit can operate even with a power supply voltage as low as 2.2 volts, given the small number of junctions in series between the power supply Vcc and the ground.

The integrated circuit which includes the amplifier according to the invention may or may not have external inputs for a signal to be amplified. It does if the integrated circuit has a signal amplifier function. It does not if it is, for example, a frequency synthesizer with input provided by an oscillator formed on the same integrated circuit chip.

The invention claimed is:

1. An integrated circuit comprising an amplifier whose final stage comprises two signal amplification input points E and E' receiving in differential mode a signal to be amplified, and four main transistors of the same type of conductivity, each having a base, an emitter and a collector, including a first transistor or output transistor mounted in common emitter configuration, whereof the collector is linked to an output of the integrated circuit, a second transistor mounted in voltage follower configuration between the point E and the base of the output transistor, a third transistor mounted in common emitter configuration, having its collector linked to the base of the output transistor, a fourth transistor mounted in voltage follower configuration having its base linked to the point E' and its emitter linked to the base of the third transistor, the circuit also comprising a first current source linked to the base of the first transistor and a second current source linked to the base of the third transistor.

2. The integrated circuit as claimed in claim 1, wherein the four transistors are all bipolar transistors.

3. The integrated circuit as claimed in claim 1, wherein the size of the output transistor is N times greater than that of the third transistor.

4. The integrated circuit as claimed in claim 3, wherein the size of the second transistor is in the same ratio N with the fourth transistor.

5. The integrated circuit as claimed in claim 4, wherein the first and second current sources supply currents in the same ratio N.

6. The integrated circuit as claimed in claim 3, wherein an emitter resistance is provided between the emitter of the output transistor and a ground, and an emitter resistance is provided between the emitter of the third transistor and the ground, the emitter resistance of the output transistor being N times smaller than the emitter resistance of the third transistor.

7. The integrated circuit as claimed in claim 1, wherein it includes a fifth transistor, having its base biased by a fixed voltage, its emitter linked to the ground via an emitter resistance, and its collector linked to the base of the third transistor.

8. The integrated circuit as claimed in claim 7, wherein the fifth transistor has a size smaller than that of the third transistor, in the same ratio as the ratio of the sizes of the first and third transistors.

9. An integrated circuit wherein it comprises two half-amplifiers as claimed in claim 1, receiving input signals that are identical and in phase opposition and having two outputs linked by a coupling circuit designed to add the output currents, phase realigned, of the half-amplifiers.

10. The integrated circuit as claimed in claim 9, wherein the outputs of the half-amplifiers are outputs of the integrated circuit and in that the coupling circuit is external to the integrated circuit.

11. The integrated circuit as claimed in claim 2, wherein the size of the output transistor is N times greater than that of the third transistor.

12. The integrated circuit as claimed in claim 4, wherein an emitter resistance is provided between the emitter of the output transistor and a ground, and an emitter resistance is provided between the emitter of the third transistor and the ground, the emitter resistance of the output transistor being N times smaller than the emitter resistance of the third transistor.

13. The integrated circuit as claimed in claim 5, wherein an emitter resistance is provided between the emitter of the output transistor and a ground, and an emitter resistance is provided between the emitter of the third transistor and the ground, the emitter resistance of the output transistor being N times smaller than the emitter resistance of the third transistor.

14. The integrated circuit as claimed in claim 2, wherein it includes a fifth transistor, having its base biased by a fixed voltage, its emitter linked to the ground via an emitter resistance, and its collector linked to the base of the third transistor.

15. The integrated circuit as claimed in claim 3, wherein it includes a fifth transistor, having its base biased by a fixed voltage, its emitter linked to the ground via an emitter resistance, and its collector linked to the base of the third transistor.

16. The integrated circuit as claimed in claim 4, wherein it includes a fifth transistor, having its base biased by a fixed voltage, its emitter linked to the ground via an emitter resistance, and its collector linked to the base of the third transistor.

17. The integrated circuit as claimed in claim 5, wherein it includes a fifth transistor, having its base biased by a fixed voltage, its emitter linked to the ground via an emitter resistance, and its collector linked to the base of the third transistor.

18. An integrated circuit wherein it comprises two half-amplifiers as claimed in claim 2, receiving input signals that are identical and in phase opposition and having two outputs linked by a coupling circuit designed to add the output currents, phase realigned, of the half-amplifiers.

19. An integrated circuit wherein it comprises two half-amplifiers as claimed in claim 3, receiving input signals that are identical and in phase opposition and having two outputs linked by a coupling circuit designed to add the output currents, phase realigned, of the half-amplifiers.

20. An integrated circuit wherein it comprises two half-amplifiers as claimed in claim 6, receiving input signals that are identical and in phase opposition and having two outputs linked by a coupling circuit designed to add the output currents, phase realigned, of the half-amplifiers.

* * * * *